United States Patent
Lee

(10) Patent No.: US 7,692,459 B2
(45) Date of Patent: Apr. 6, 2010

(54) HIGH RESOLUTION DELAY ADJUSTOR

(75) Inventor: Chao-Cheng Lee, Science-Based Industrial Park (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/878,411

(22) Filed: Jul. 24, 2007

(65) Prior Publication Data
US 2008/0048748 A1 Feb. 28, 2008

(30) Foreign Application Priority Data
Jul. 26, 2006 (TW) .............................. 95127206 A

(51) Int. Cl.
*H03H 9/38* (2006.01)
*H03M 1/12* (2006.01)

(52) U.S. Cl. .................. 327/149; 327/158; 327/276; 341/156

(58) Field of Classification Search ............... None
See application file for complete search history.

(56) References Cited

U.S. PATENT DOCUMENTS

| 5,923,715 | A | * | 7/1999 | Ono ............................ 375/376 |
| 6,181,218 | B1 | * | 1/2001 | Clark et al. .............. 331/177 R |
| 6,337,682 | B1 | * | 1/2002 | Hwang ........................ 345/213 |
| 6,486,812 | B1 | * | 11/2002 | Tanaka ........................ 341/144 |
| 6,885,331 | B2 | * | 4/2005 | Krymski ...................... 341/169 |
| 7,274,321 | B2 | * | 9/2007 | Hurrell et al. ............... 341/156 |
| 2007/0103248 | A1 | * | 5/2007 | Nakamura et al. .......... 331/167 |
| 2007/0176494 | A1 | * | 8/2007 | Medi et al. .................. 307/109 |

FOREIGN PATENT DOCUMENTS

TW 540051 7/2003

* cited by examiner

*Primary Examiner*—Lincoln Donovan
*Assistant Examiner*—Terry L Englund
(74) *Attorney, Agent, or Firm*—Muncy, Geissler, Olds & Lowe, PLLC

(57) ABSTRACT

A delay adjustor for adjusting the delay time of a signal, the adjustor comprising: a first capacitance unit and a variable capacitance unit serially coupled to the first capacitor wherein the capacitance of the variable capacitance unit is adjusted according to a first control signal and the variable capacitance unit comprises a plurality of second capacitors and at least a first switch coupled to the at least one capacitor of the second capacitors.

17 Claims, 3 Drawing Sheets

HIGH RESOLUTION DELAY ADJUSTOR

BACKGROUND OF THE INVENTION (a) Field of the Invention

The invention relates to a delay adjustor, and particularly to a delay adjustor having high propagation delay time resolution.

(b) Description of the Related Art

Inside an integrated circuit, signal could be influenced by the parasitic capacitor of metal line, driving current, supply voltage and other factors and thereby generating the propagation delay time when the signal is transmitting. Such propagation delay time should be properly considered in some circuit applications. In general, the propagation delay time is given by:

$$Td = \frac{C}{I} \times \left(\frac{1}{2}\right) \times Vdd \qquad (1)$$

where Td is the propagation delay time, C is the parasitic capacitor, I is the driving current, and Vdd is the supply voltage. As an integrated circuit is influenced by process, voltage and temperature variation, the propagation delay time becomes unpredictable and may cause the integrated circuit to operate abnormally. Therefore, under certain circumstances, the propagation delay time needs to be well compensated. In the related prior arts, it is common to use the capacitor-paralleling method to adjust propagation delay time. In current processes, this approach can achieve about 10 ps adjustable resolution for propagation delay time. However, in some high-speed circuits or some special circuit applications, higher adjustable resolution is needed in order to improve the overall circuit characteristics.

BRIEF SUMMARY OF THE INVENTION

One object of the present invention is to provide a delay adjustor having high propagation delay time resolution.

According to the present invention, which discloses a delay adjustor, for adjusting the propagation delay time of a signal, comprising: a first capacitance unit; a variable capacitance unit that is coupled in series to the first capacitance unit wherein the capacitance of the variable capacitance unit is adjusted according to a first control signal. The variable capacitance unit further comprises a plurality of second capacitors and at least one first switch coupled to at least one of the second capacitors.

DETAILED DESCRIPTION OF THE INVENTION

Detail descriptions of the preferred embodiments together with figures will be provided in the following in order to make the invention thoroughly understood. The application of the invention is not confined to specific details. On the other hand, the arrangement and position of each element in every embodiment can be altered as long as it is still within the scope of the invention. However, it should be recognized that the present invention can be practiced in a wide range of other embodiments besides those explicitly described, that is, this invention can also be applied extensively to other embodiments, and the scope of the present invention is expressly not limited except as specified in the accompanying claims. The term "coupled to" mentioned herein includes the meaning of both "directly coupled to" and "indirectly coupled to".

Figure 1:
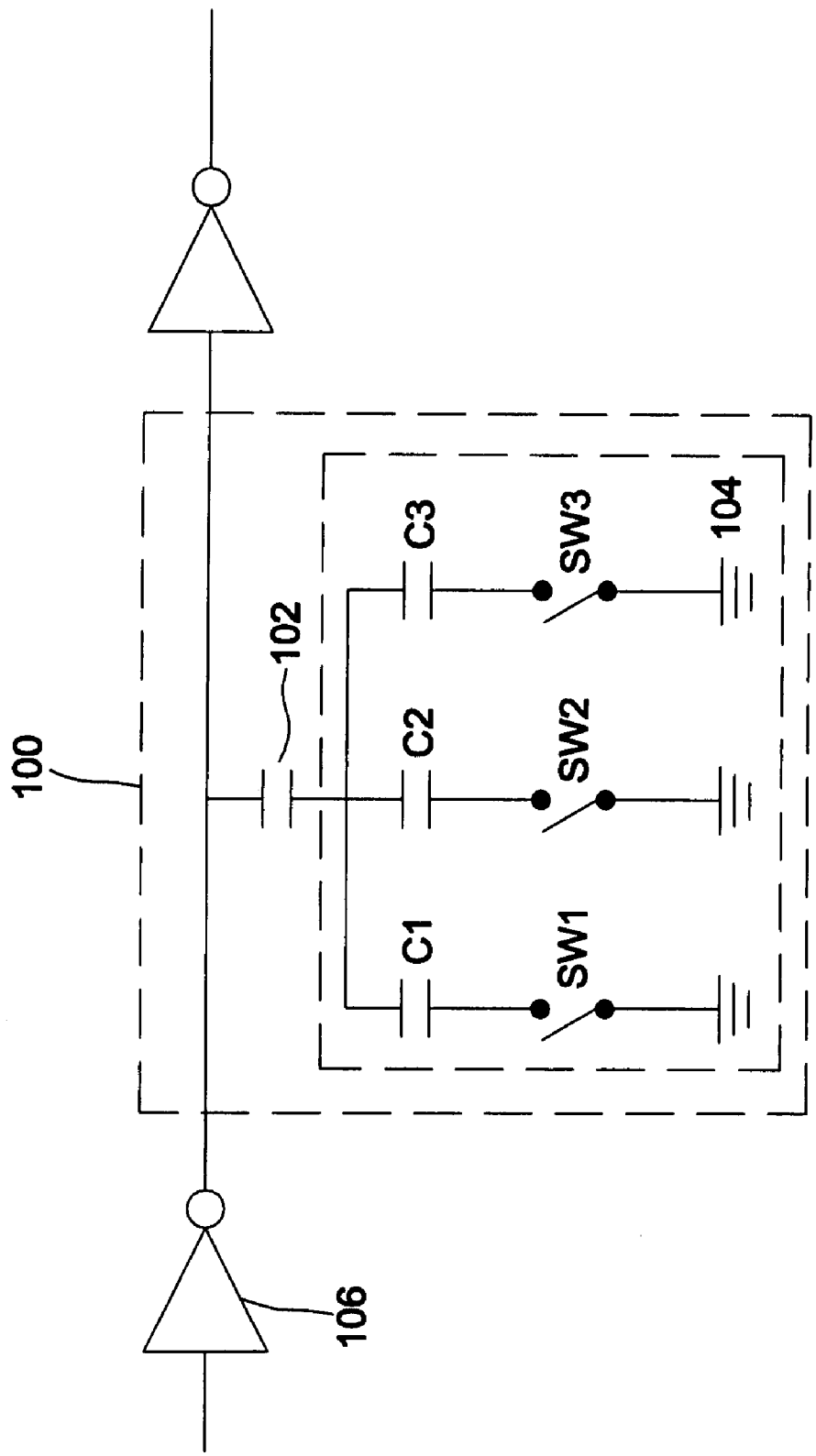
FIG. 1 shows a schematic diagram illustrating a delay adjustor according to one embodiment of the present invention.

FIG. 1 shows a schematic diagram illustrating a delay adjustor 100 according to one embodiment of the present invention. The delay adjustor 100 is coupled to an output terminal of an application circuit 106 for adjusting the propagation delay time of the output signal of the application circuit 106. The delay adjustor 100 includes a capacitance unit 102 and a variable capacitance unit 104 wherein the capacitance unit 102 and the variable capacitance unit 104 form a serial connecting structure. The variable capacitance unit 104 includes capacitors C1, C2, C3 and transistor switches SW1, SW2, SW3 wherein the capacitor C1 is coupled to the transistor switch SW1, the capacitor C2 is coupled to the transistor switch SW2 and the capacitor C3 is coupled to the transistor switch SW3. For clarity, assuming the equivalent capacitance of the capacitance unit 102 is Cx, the equivalent capacitance of the variable capacitance unit 104 is Cy, and the equivalent capacitance of the delay adjustor 100 is Ceff, due to the capacitance unit 102 and the capacitance unit 104 are coupled in series, the equivalent capacitance Ceff of the delay adjustor is given by:

$$Ceff = \frac{Cx \times Cy}{Cx + Cy} \qquad (2)$$

If Cy=α*Cx and α>>1, then $$Ceff = \left(\frac{\alpha}{1+\alpha}\right) \times Cx = \left(\frac{1}{1+\frac{1}{\alpha}}\right) \times Cx \cong \left(1 - \frac{1}{\alpha}\right) \times Cx \qquad (3)$$

According to the above equation, if a large α value is chosen, such as α=100, then Ceff=0.99*Cx. This is equal to adjust capacitance Cx by 1%. In view of the propagation delay time of the circuit, by using the delay adjustor 100, the resolution of the delay time adjustment can be increased to 0.1 ps. Thus, a circuit designer can use control signals to control the transistor switches SW1, SW2 and SW3 to adjust the capacitance Cy of the variable capacitance unit 104 so as to obtain the desired signal propagation delay time. Depend on the design requirements, the control signals can be either analog control signals or digital control signals. Although the embodiment uses an α of 100 as an example, α can also be any other value, such as α larger than or equal to 2, α larger than or equal to 10, and α larger than or equal to 20. Furthermore, the capacitor described herein can be implemented by metal capacitor, poly-silicon capacitor or metal-oxide-silicon (MOS) capacitor.

Figure 2:
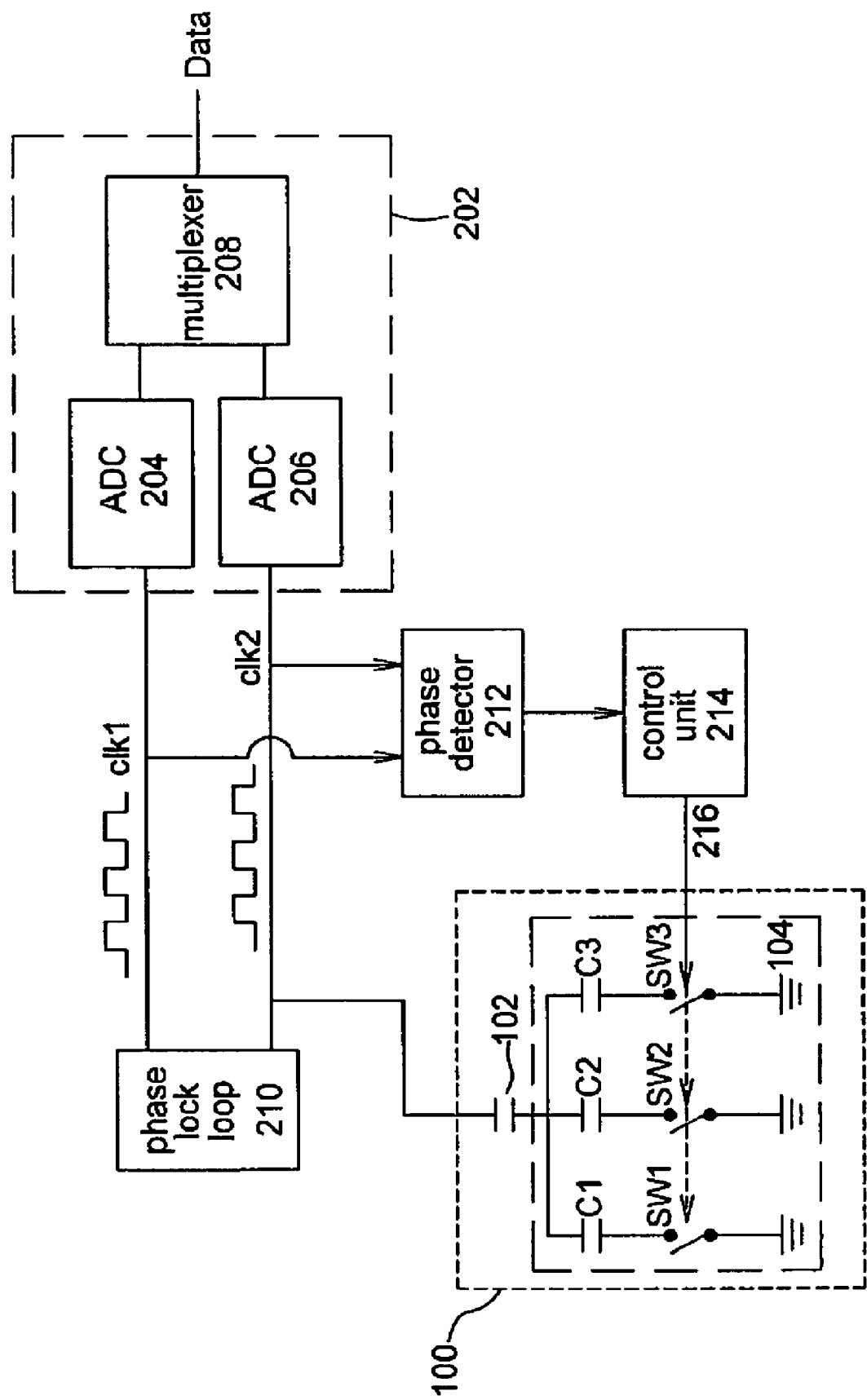
FIG. 2 shows a schematic diagram illustrating a delay adjustor applied in a time-interleaved analog-to-digital converter according to one embodiment of the present invention.

FIG. 2 shows a schematic diagram illustrating the delay adjustor 100 applied in a time-interleaved analog-to-digital converter 202 according to one embodiment of the invention. The time-interleaved analog to digital converter 202 includes a first analog to digital converter 204, a second analog to digital converter 206 and a multiplexer 208 wherein the first analog to digital converter 204 and the second analog to digital converter 206 receive clock signals clk1 and clk2 which are output from a phase lock loop 210, respectively. There is a phase difference of 90 degrees between the clock signals clk1 and clk2. Since these clock signals are used for the clock of sampling, the clock signals clk1 and clk2 are important reference signals in the time-interleaved analog to digital converter 202. If the phases of the clock signals clk1 and clk2 do not match, that is, the phase difference is not 90 degrees, then it influences the operation of the time-interleaved analog to digital converter 202 and timing error will be generated. Therefore, the delay adjustor 100 can be used to adjust the phase error of the two clock signals clk1 and clk2, so that the time-interleaved analog to digital converter can be operated in normal function. As shown in FIG. 2, the delay adjustor 100 is coupled to the output terminal of the phase lock loop 210, a phase detector 212 is used to detect the phase error of the clock signals clk1 and clk2 and generates a detection result to a control unit 214, and the control unit 214 then generates a control signal 216 based on the detection result. The control signal 216 is transmitted to the variable capacitance unit 104 of the delay adjustor 100 in order to change the capacitance of the variable capacitance unit 104 so as to adjust the phase of the clock signal clk2. By adjusting the phase of the clock signal clk2, the phase difference between the clock signals clk1 and clk2 can be substantially equal to 90 degrees.

Figure 3:
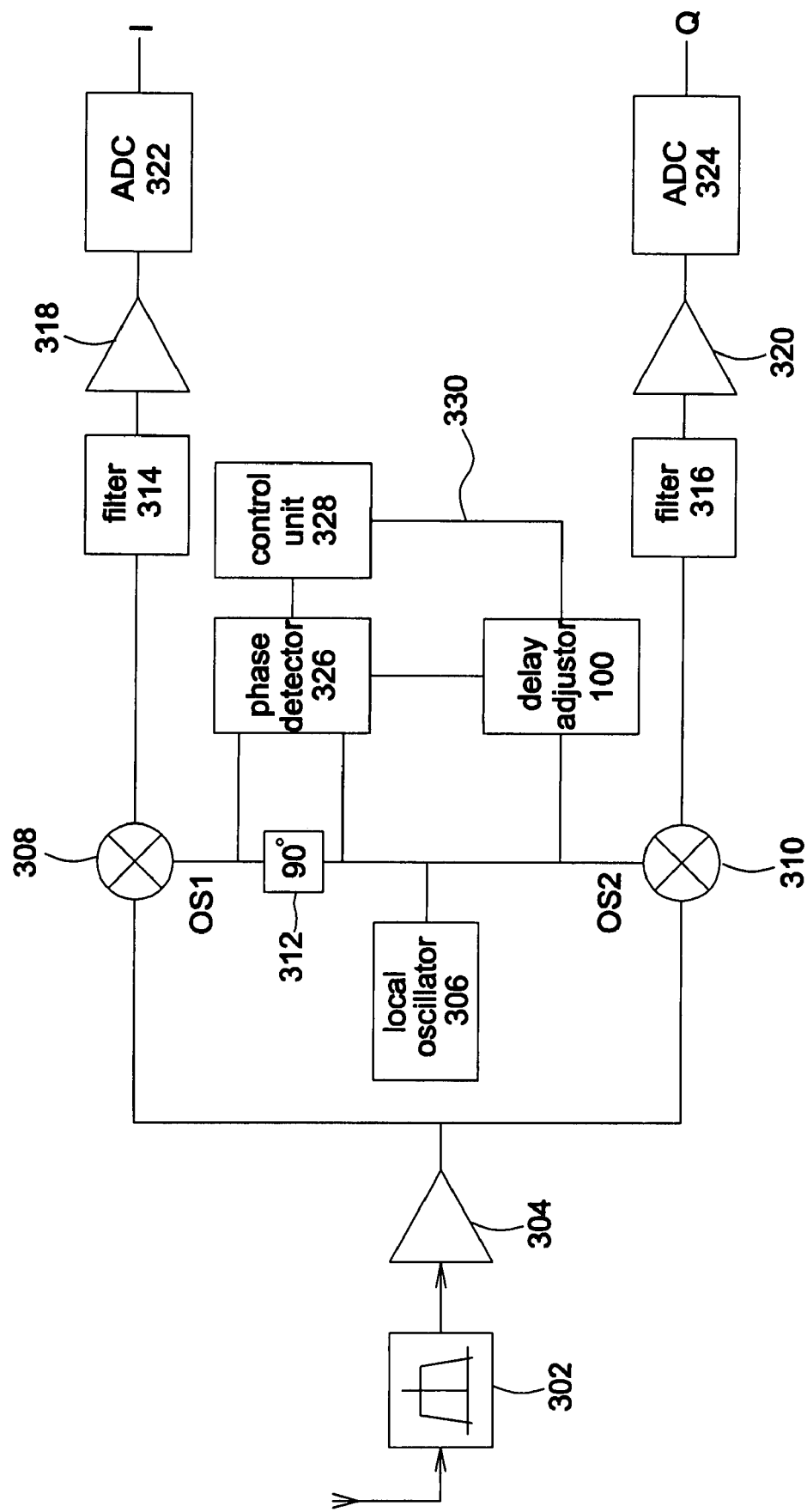
FIG. 3 shows a schematic diagram illustrating a delay adjustor applied in a receiver according to one embodiment of the invention.

FIG. 3 s shows a schematic diagram illustrating the delay adjustor 100 applied in a receiver according to one embodiment of the invention. The receiver comprises a band selector 302, a low noise amplifier (LNA) 304, a local oscillator (LO) 306, a first mixer 308, a second mixer 310, a phase shifter 312, a first filter 314, a second filter 316, a first variable gain amplifier (VGA) 318, a second variable gain amplifier 320, a first analog to digital converter 322, and a second analog to digital converter 324. When a signal is received, it passes through the band selector 302 and the low noise amplifier 304 and then is fed to the mixers 308 and 310. The mixers 308 and 310 mix the input signal with oscillation signals OS1 and OS2 respectively while OS1 and OS2 have a phase difference of 90 degrees. After mixed, the signal is further processed by the filters, the variable gain amplifiers, and the analog to digital converters so as to provide output signals, I and Q. But, the oscillation signals OS1 and OS2 may be influenced by production process, voltage, temperature drift, and other factors, so that the receiver will have an IQ mismatch between signals I and Q to affect the operation of the overall circuit. Therefore, the delay adjustor 100 can be used to adjust the phase error of the two oscillation signals OS1 and OS2 to reduce the IQ mismatch problem of the I signal and the Q signal so that the receiver can operate normally. As shown in FIG. 3, the delay adjustor 100 is coupled to the output terminal of the local oscillator 306 and a phase detector 326 is used to detect the phase error of the clock signals OS1 and OS2 to generate a detection result to a control unit 328. The control unit 328 generates a control signal 330 based on the detection result and transmits the control signal 330 to the variable capacitance unit 104 of the delay adjustor 100 in order to change the capacitance of the variable capacitance unit 104 so as to adjust the phase of the OS2. By adjusting the phase of the oscillation signal OS2, the phase difference between the oscillation signals OS1 and OS2 can be equal to 90 degrees.

According to another embodiment of the present invention, the capacitance unit 102 of the delay adjustor 100 of FIG. 1 is a variable capacitance unit 102, wherein the structure of the variable capacitance unit 102 is similar to the variable capacitance unit 104 of FIG. 1 including of a plurality of capacitance units and corresponding switches. By simply designing the capacitance of the plurality of capacitance units of the variable capacitance unit 102 and the variable capacitance unit 104, the variable capacitance unit 102 can be considered as a coarse delay adjusting unit and the variable capacitance unit 104 can be considered as a fine delay adjusting unit. The detail operation of such embodiment is similar to the embodiment shown in FIG. 1 and will not be further described herein.

While the invention has been described by way of applying in a time-interleaved analog to digital converter and a receiver, a delay adjustor formed by coupling a capacitance unit and a variable capacitance unit in series can be applied in other application areas, such as analog to digital converters for processing RGB signals in analog video front end devices and transmitters in the communication areas. Furthermore, the locations of the capacitance unit 102 and the variable capacitance unit 104 in the circuit can be interchanged without affecting the effectiveness of the invention. Although the delay adjustor of the invention is formed by connecting a capacitance unit and a variable capacitance unit in series, it is to be understood that other circuits originated from the above described concept are considered within the scope of the invention.

The above descriptions are some of the preferred embodiments according to the invention. It is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A delay adjustor for adjusting the delay time of a signal, comprising:
   a first capacitance unit; and
   a variable capacitance unit coupled in series to the first capacitance unit;
   wherein the capacitance of the variable capacitance unit is at least two times larger than the capacitance of the first capacitance unit and adjusted according to a first control signal, the first control signal is used to adjust the delay time of the signal, and the variable capacitance unit comprises a plurality of first capacitors and at least one first switch coupled to at least one of the first capacitors; and
   wherein the delay adjustor is coupled to an analog-to-digital converter and the analog-to- digital converter is a time-interleaved analog-to-digital converter.

2. The delay adjustor according to claim 1, wherein the first capacitance unit is a second variable capacitance unit and its capacitance is adjusted according to a second control signal.

3. The delay adjustor according to claim 2, wherein the first capacitance unit comprises a plurality of second capacitors and at least one second switch coupled to at least one of the second capacitors.

4. The delay adjustor according to claim 1, wherein the signal is a first clock signal.

5. The delay adjustor according to claim 4, wherein the delay adjustor is coupled to the output terminal of a phase locked loop.

6. The delay adjustor according to claim 5, wherein the time-interleaved analog-to-digital converter comprises:
   a detection unit for detecting the phase difference of the first clock signal and a second clock signal; and
   a control unit coupled to the detection unit for generating the first control signal according to the detection result from the detection unit.

7. The delay adjustor according to claim 1, wherein the delay adjustor is applied in a receiver.

8. The delay adjustor according to claim 7, wherein the signal is a first oscillating signal.

9. The delay adjustor according to claim 8, wherein the receiver comprises:
- a first mixer for mixing an input signal and the first oscillating signal; and
- a second mixer for mixing the input signal and a second oscillating signal;
- wherein the first oscillating signal and the second oscillating signal have a phase difference substantially equal to 90 degrees.

10. The delay adjustor according to claim 9, wherein the delay adjustor is coupled to the first mixer and the delay adjustor adjusts the phase difference between the first oscillating signal and the second oscillating signal according to the first control signal.

11. The delay adjustor according to claim 10, wherein the receiver further comprises:
- a detection unit for detecting the phase difference between the first oscillating signal and the second oscillating signal; and
- a control unit coupled to the detection unit for generating the first control signal according to the detection result from the detection unit.

12. The delay adjustor according to claim 1, wherein the signal is an oscillating signal.

13. The delay adjustor according to claim 1, wherein the control signal is a digital control signal.

14. The delay adjustor according to claim 1, wherein the control signal is an analog control signal.

15. The delay adjustor according to claim 1, wherein the first capacitance unit and each of the first capacitors are metal capacitors.

16. The delay adjustor according to claim 1, wherein the first capacitance unit and each of the first capacitors are polysilicon capacitors.

17. The delay adjustor according to claim 1, wherein the first capacitance unit and each of the first capacitors are metal-oxide-silicon (MOS) capacitors.

* * * * *